United States Patent [19]  
Crank

[11] 4,434,037  
[45] Feb. 28, 1984

[54] HIGH RATE SPUTTERING SYSTEM AND METHOD

[75] Inventor: James D. Crank, Redwood City, Calif.

[73] Assignee: Ampex Corporation, Redwood City, Calif.

[21] Appl. No.: 512,799

[22] Filed: Jul. 11, 1983

Related U.S. Application Data

[63] Continuation of Ser. No. 283,764, Jul. 16, 1981, abandoned.

[51] Int. Cl.³ .............................................. C23C 15/00
[52] U.S. Cl. .................................. 204/192 R; 204/298
[58] Field of Search ............................ 204/298, 192 R

[56] References Cited

U.S. PATENT DOCUMENTS

| | | | |
|---|---|---|---|
| 3,775,285 | 11/1973 | Lane | 204/298 |
| 3,884,787 | 5/1975 | Kuehnle | 204/298 |
| 3,898,952 | 8/1975 | Shirahata | 204/298 |
| 4,013,539 | 3/1977 | Kuehnle | 204/298 |
| 4,116,791 | 9/1978 | Zega | 204/298 |
| 4,137,142 | 1/1979 | Vertegaal | 204/298 |
| 4,261,808 | 4/1981 | Walter et al. | 204/298 |
| 4,322,276 | 3/1982 | Meckel et al. | 204/298 |

FOREIGN PATENT DOCUMENTS 705794  5/1941  Fed. Rep. of Germany .

Primary Examiner—Arthur P. Demers  
Attorney, Agent, or Firm—J. D. Talcott; E. E. Strnad

[57] ABSTRACT

A high rate sputtering device and method provide an extended life moveable cathode/target allowing increased current density. The cathode/target may be provided as a moving ribbon or rotating drum or disk, passing through the active plasma while the cooling of the cathode/target is improved. Alternatively, the cathode/target may be formed as a rod fed into the active plasma.

58 Claims, 10 Drawing Figures

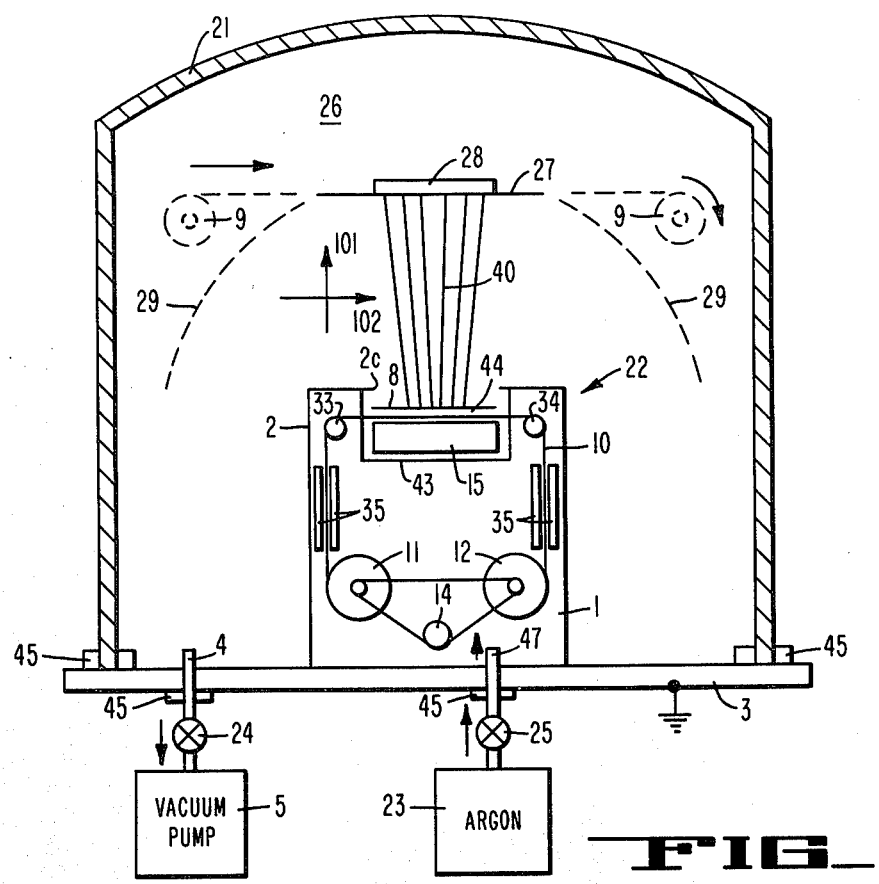
FIG_1
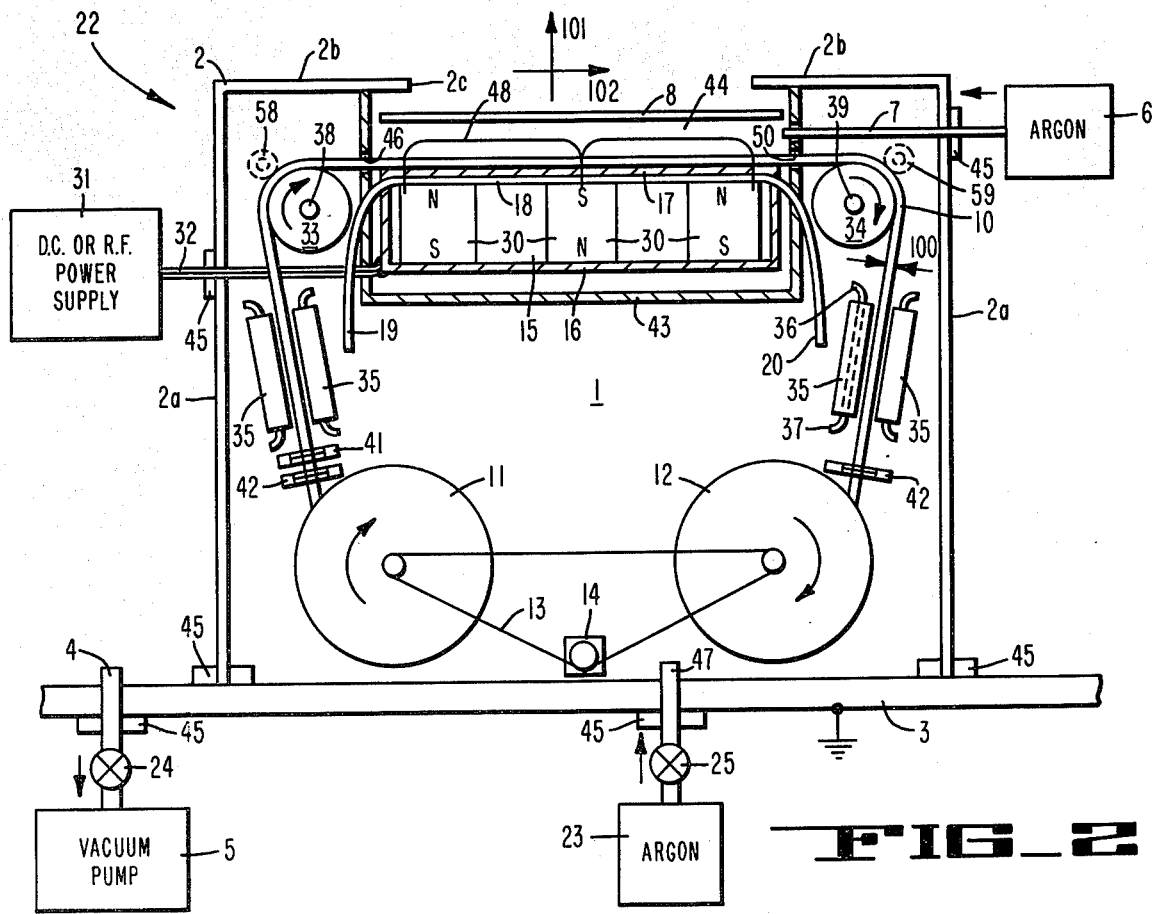
FIG_2

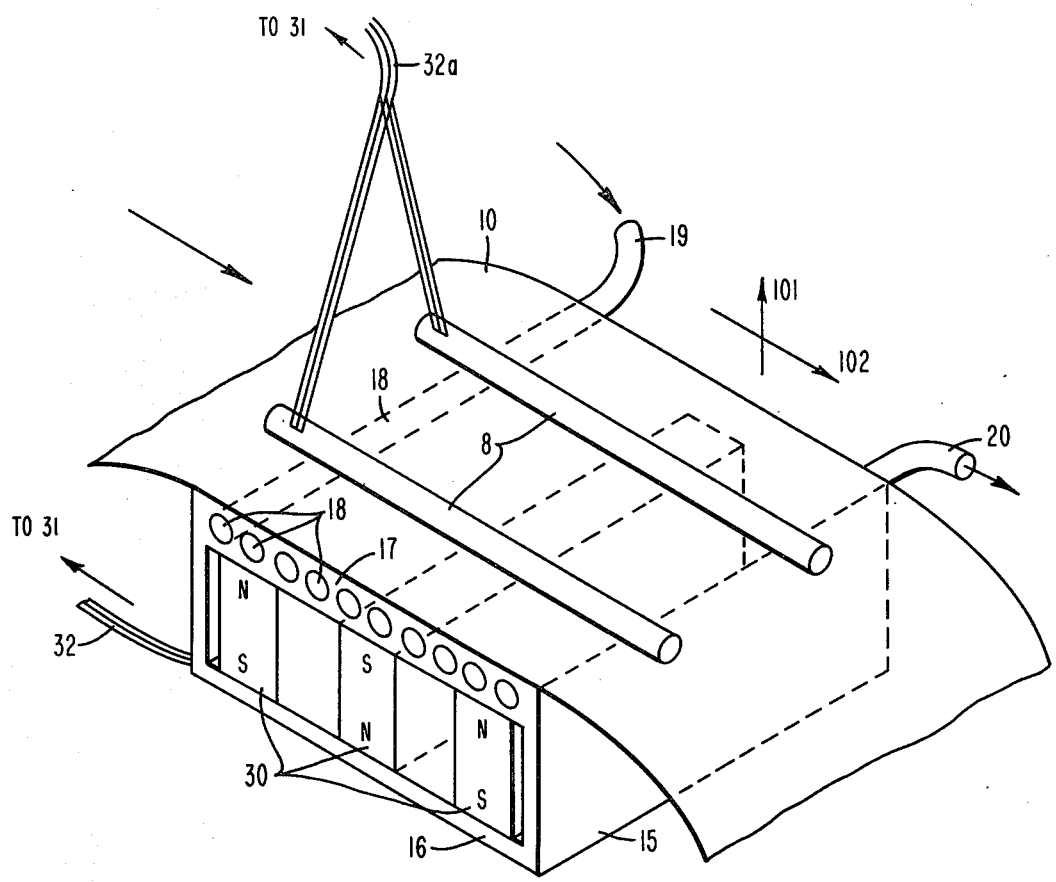
FIG_3
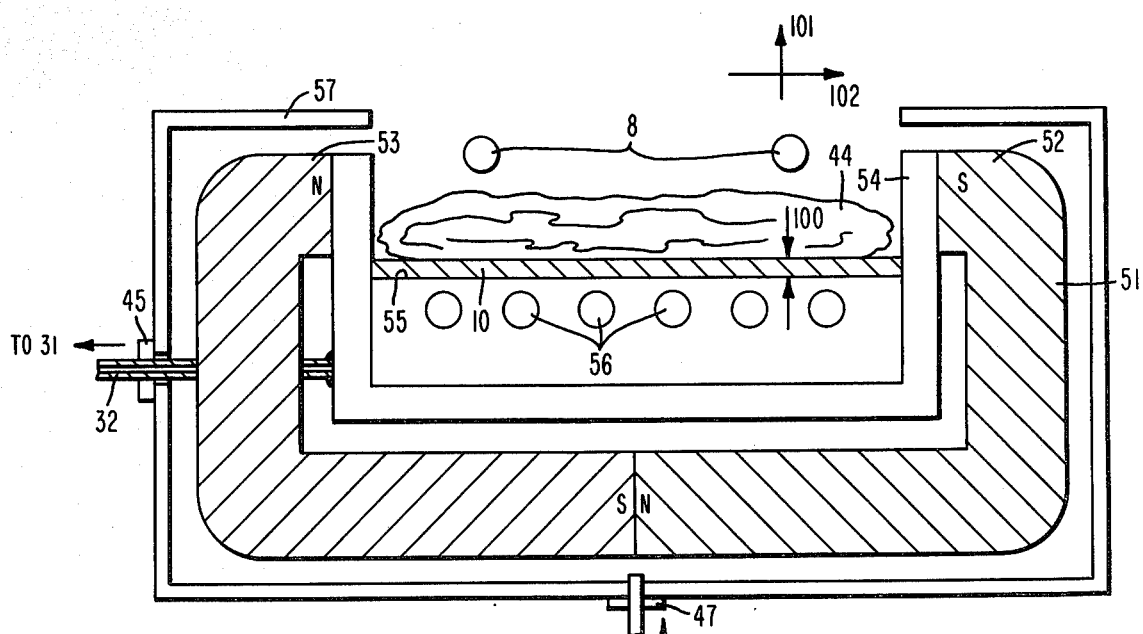
FIG_4

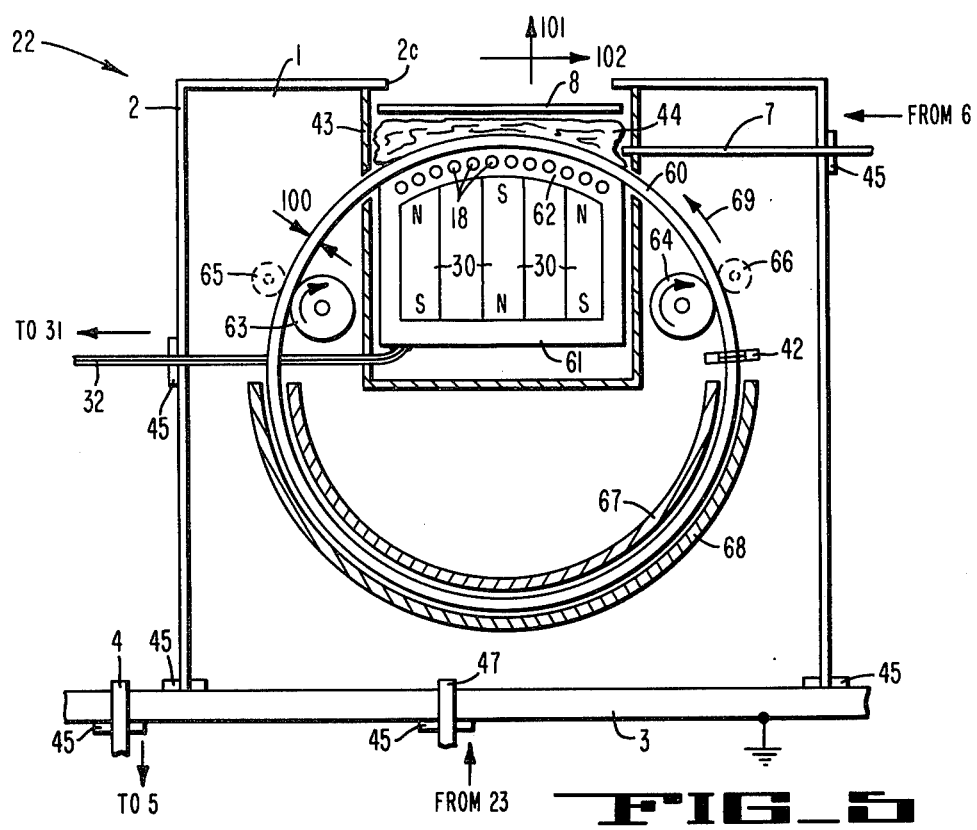
FIG_5
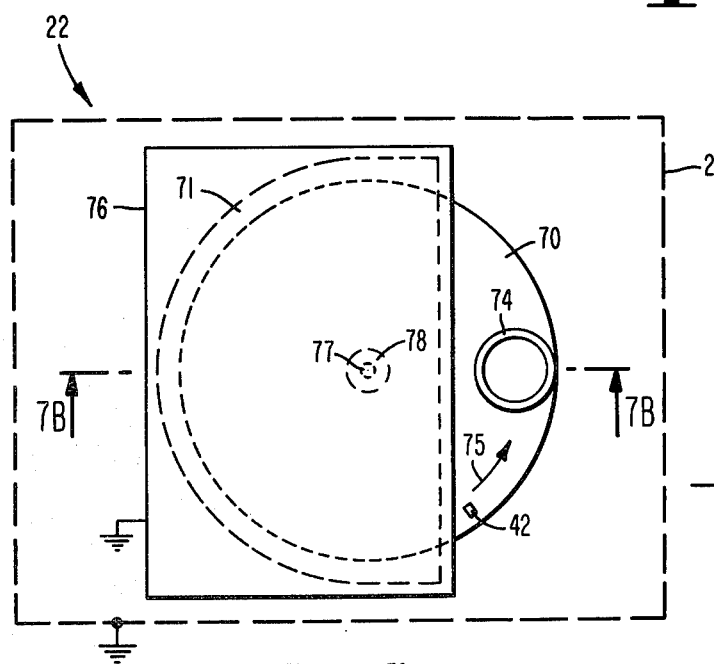
FIG_6A
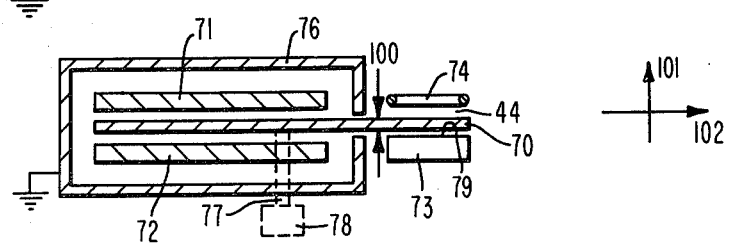
FIG_6B

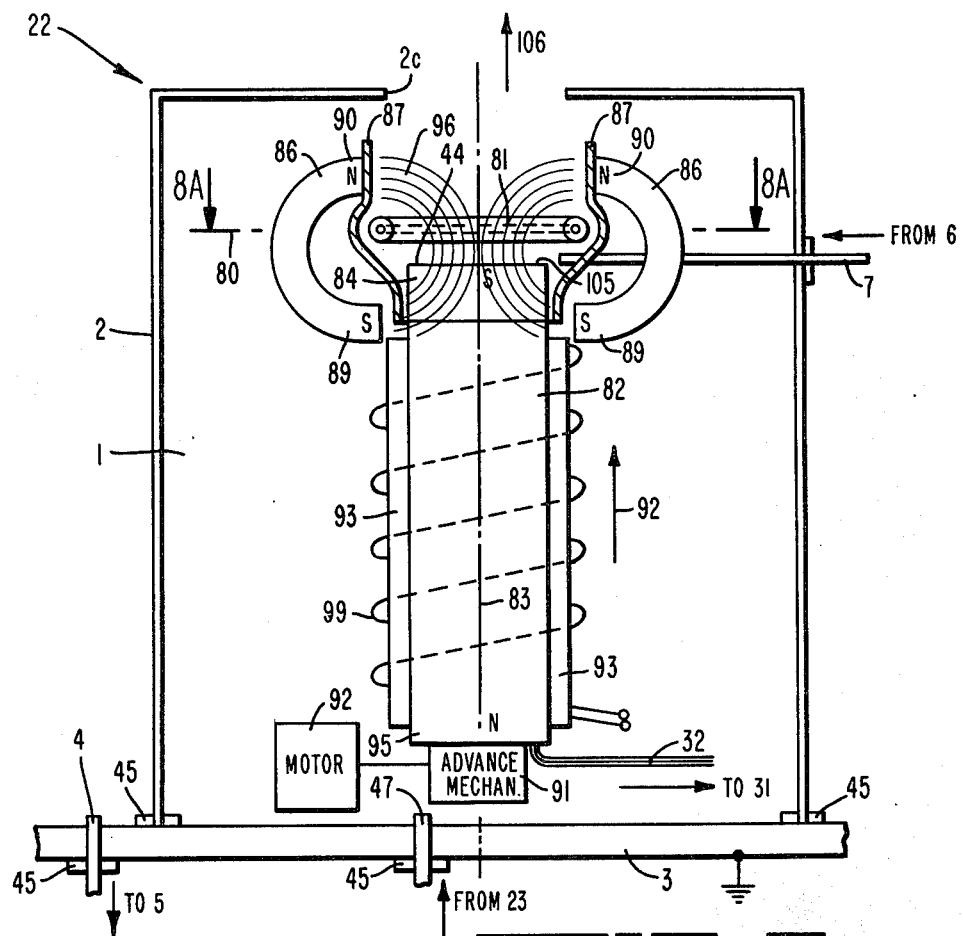
FIG_7
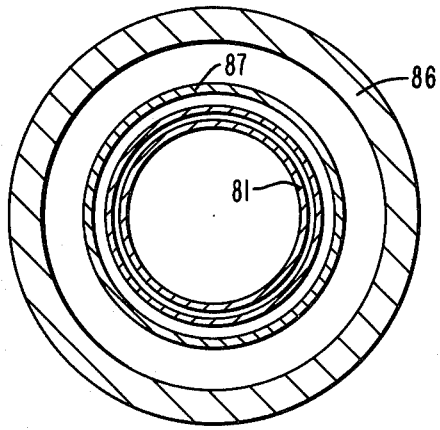
FIG_8A
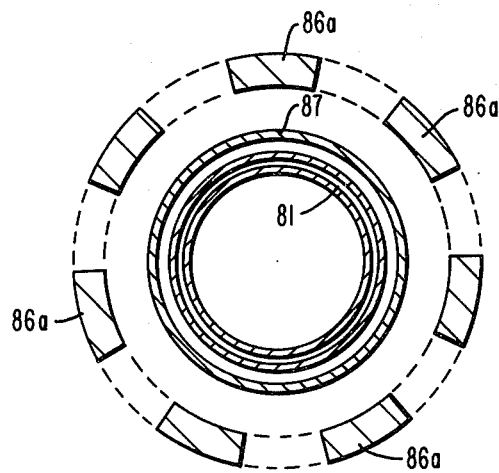
FIG_8B

HIGH RATE SPUTTERING SYSTEM AND METHOD

This is a continuation, of application Ser. No. 283,764 filed July 16, 1981, now abandoned.

BACKGROUND OF THE INVENTION

The invention relates to a high rate sputtering system and method wherein the life of the target is extended. It is suitable for sputtering of a wide range of materials in magnetically enhanced or other types of sputtering devices.

In the art of sputtering, target erosion is a serious problem limiting the life of the target. Another problem is target overheating, which can be reduced for example by lowering the power density of the target. The latter provision, however, decreases the rate of material deposition. In addition, when sputtering magnetic materials by magnetically enhanced sputtering systems, the thickness of the target has to be relatively small to prevent diversion of the plasma confining magnetic field, and, consequently, weakening of the plasma. The above-indicated disadvantages limit the performance and effective utilization of the prior art devices for sputtering both magnetic and nonmagnetic materials because of frequent interruptions of the operation due to necessary replacement of the target material.

An example, where the low rate of sputtering obtained by the presently available prior art devices is particularly inconvenient are continuous operations, such as in manufacturing of tape for magnetic recording and reproduction. Thus, it is desirable to obtain a higher sputtering rate to increase the rate of manufacturing magnetic tape by sputtering.

SUMMARY OF THE INVENTION

Accordingly, it is an object of the present invention to provide a high rate sputtering device and method in which the target has an extended life.

It is a further object to provide a high rate sputtering device utilizing a moveable target with improved cooling to minimize target erosion and extend target performance.

It is another object to provide a high rate sputtering device and method, having a continuously fed target with respect to the active plasma where only a relatively small portion of the target is exposed to the plasma at any given time.

It is a further object to provide a high performance sputtering device and method having improved cooling of the target and thus permitting an increased current density of the cathode/target.

It is still a further object to provide a high performance sputtering apparatus and method having a moveable target which is fed into the plasma-confining area at a predetermined rate and which is suitable for use with direct current (D.C.) or radio frequency (R.F.) biased sputtering systems, including magnetically enhanced and other types of sputtering techniques.

It is another object to provide a high rate magnetically enhanced sputtering device and method, comprising a moveable target of magnetic material having an extended life and which target does not divert the surrounding plasma confining magnetic field.

It is a further object to provide a sputtering device and method, of an improved efficiency having the above-indicated features and suitable for high rate deposition of magnetic material on a substrate, for example for use in manufacturing of magnetic tape and similar articles.

These and other objects of the invention are obtained by an apparatus and method for high rate sputtering in vacuum of a selected target material on a substrate wherein an anode and a moveable cathode/target in accordance with the invention are respectively arranged in a vacuum chamber. An active plasma is formed between the latter electrodes. The moveable cathode/target is arranged at a distance from the substrate. Means are also provided which move the cathode/target with respect to the active plasma in such a way that a portion of the cathode/target is arranged at any given time during the sputtering operation within the active plasma while another contiguous portion of the cathode/target is arranged outside the active plasma.

The foregoing and other objects, features and advantages of the invention will become apparent from the following description and accompanying drawings describing and illustrating the preferred embodiments of the invention.

BRIEF DESCRIPTION OF THE DRAWINGS

FIG. 1 is a simplified diagramatic view of a sputtering apparatus in accordance with a preferred embodiment of the present invention.

FIG. 2 is an enlarged fragmentary view corresponding to a portion of FIG. 1.

FIG. 3 is a perspective view corresponding to a portion of FIG. 2.

FIG. 4 is a section view showing an alternative embodiment to the portion shown in FIG. 3.

FIG. 5 is an enlarged fragmentary view similar to FIG. 2 of another embodiment of the invention.

FIGS. 6A and 6B are simplified diagramatic top and cross sectional views illustrating a further embodiment of the invention.

FIG. 7 is an enlarged fragmentary view of a still further preferred embodiment of the invention.

FIG. 8A is a partial cross sectional view taken along line 8A—8A of FIG. 7.

FIG. 8B is a partial cross sectional view similar to FIG. 8A showing alternate structure for the embodiment to FIG. 7.

DESCRIPTION OF THE PREFERRED EMBODIMENTS

First, a general description of the apparatus and method of the invention will be given with reference to FIG. 1, followed by a more detailed description of the various embodiments, shown in FIGS. 2 to 8B.

FIG. 1 shows a vacuum chamber 26 surrounded by housing 21 attached to a base plate 3 in a vacuum tight manner and grounded, as it is well known in the art. A vacuum pump 5 and source 23 of suitable gas, for example argon, are respectively connected to chamber 21. A substrate 27 to be sputtered by a selected target material is attached to a base 28 at a distance from a sputtering gun assembly 22. The substrate 27 may be stationary or, alternatively, moveable, such as flexible tape made of a suitable plastic material, as well known for example from magnetic tape manufacturing. In case a moveable target 27 in the form of a plastic tape is utilized, it may be transported over the base 28 between two corresponding reels 9, which may be shielded from unwanted sputtering by shields 29, as it is schematically shown in phantom in FIG. 1. The sputtering gun assembly 22 includes a cathode 10, which is made moveable, as it will be described later in more detail, and an anode 8. Depending on the specific application, a necessary D.C. or R.F. power supply (not shown in FIG. 1 for simplicity), instead of supplying power to the anode 8, may be connected to the substrate assembly 27, 28, which then becomes the anode for practical purposes of sputtering as well known in the art. An electric field, in a direction indicated by arrow 101 is provided between the anode 8 and cathode 10.

Depending on the particular application, the cathode 10 may be formed entirely of the selected target material to be sputtered on the substrate or, alternatively, only a face portion of the cathode 10 may be made of the target material, while an underlying portion thereof can be made of a different suitable material. To simplify the description, in the following specification the term cathode/target will be utilized to indicate the foregoing possible alternative implementations of the cathode.

It is a particular and important feature of the present invention that a high energy glow discharge, also referred to as active plasma, is formed between the anode and a cathode which is moveable in accordance with the sputtering apparatus of the invention. The latter feature is shown in FIG. 1 where the cathode/target 10 is provided, for example, in the form of a moveable ribbon transported between two corresponding feed/takeup reels 11, 12. The path of the ribbon cathode/target 10 includes drive or guide rollers 33, 34 and a cooled backing structure 15 for contacting and slideably guiding the ribbon 10 in close proximity of anode 8 and at a predetermined distance therefrom, as required by a particular sputtering application. The source of suitable D.C. or R.F. potential is connected to both the anode 8 and cathode 10 for providing a glow discharge between the latter electrodes. Thus, in the area 44 between these electrodes, a hot, high energy plasma is developed, utilizing accelerated particles of a suitable inert gas from the source 23. Since, in accordance with the invention the ribbon cathode 10 moves continuously through the hot plasma 44, only a relatively small portion of the cathode/target 10 is exposed to the conditions within the plasma at any time. Besides the cooling structure 15, additional radiation cooling devices 35 are placed along the path of the moveable cathode 10 outside the plasma area 44. Consequently, when comparing to prior art devices having a stationary cathode/target, it is seen that cooling of the ribbon cathode/target is significantly improved and thus the current density and sputtering rate of the device of the invention respectively, can be significantly increased without unduly limiting system operating time. Shields 2, 29 and 43 are respectively utilized to prevent sputtering outside a desired area, as it will be described later in more detail.

The moveable feature of the cathode/target represents a further improvement over the art when sputtering magnetic materials, utilizing magnetically enhanced sputtering techniques. Particularly, the present invention allows utilization of a magnetic target for example in the form of a flexible ribbon, hollow drum or disk, having a relatively small thickness 100 (see FIG. 2), for example, of 1 to 50 mils, approximately. Such a thin target can be easily supersaturated by the plasma confining magnetic field, to obtain a desired concentration and control of the glow discharge, and thus to provide well known desirable sputtering conditions. In the present description the term "supersaturation" is utilized to describe the condition of a relatively thin magnetic target material which is magnetically saturated as a result of its presence in the plasma confining magnetic field, which field is greater than necessary to magnetically saturate the target material. It is a further advantage that the speed of the moveable target can be selected with respect to a required current density and obtainable cooling rate as being related to the particular material of the target. Thus, when the power density requirement per surface unit of the target increases, the speed of the moveable target may be increased accordingly to prevent overheating thereof, as it will follow from a more detailed description below.

FIG. 2 is a simplified representation corresponding to the sputtering gun assembly 22 of FIG. 1, in accordance with the preferred embodiment of the present invention. It comprises an inner vacuum chamber 1 surrounded by an outer shield 2 including side walls 2a, upper walls 2b and a portion of base plate 3. An opening 2c is formed by the walls 2b, which opening may be of circular, rectagular or any other convenient shape. Opening 2c serves as an orifice for particles of the target material accelerated by the gun, to be deposited on a stationary or moveable substrate 27, as it is represented schematically by lines 40 (FIG. 1). The substrate 27 is located at a desired distance from opening 2c. The outer shield 2, base plate 3, and housing 21 are preferably made of a nonmagnetic conductive material, such as stainless steel or aluminum, and are connected to ground potential. Consequently, the latter elements 2, 3 and 21 must be electrically insulated by well known means from the remaining elements inside the vacuum chamber 26 which are at high cathode or anode potential As previously described, a vacuum pump 5 is connected to the vacuum chamber 26 by conduit 4 in a conventional manner and a source 23 of a suitable inert gas, for example argon, is connected to vacuum chamber 1 by conduit 47. As best shown in FIG. 3 within the vacuum chamber 1 there is mounted a stationary anode 8, preferably in the form of two parallel rods, for example made of suitable steel material The cathode/target 10 is arranged with its plane in parallel with the anode 8 and at a suitable distance therefrom. The entire material of the ribbon cathode 10 is preferably made of a metallic magnetic material, for example 80% Cobalt and 20% Nickel and it is deposited by sputtering on substrate 27 (FIG. 1). Such a relatively small thickness 100 (about 1 to 50 mils) of cathode/target 10 is necessary to obtain a desired supersaturated state thereof in the magnetically enhanced sputtering system of the preferred embodiment. However, it is understood that the present invention is not limited to the above-indicated configurations and alternatively, only the face of the cathode, i.e., its side facing the anode, may be formed from the target material, as it is known in the art.

Ribbon 10 at its opposite ends is respectively wound on two corresponding reversible feed/take-up reels 11, 12, arranged in the lower end of the inner vacuum chamber 1, away from the anode 8. The reels 11, 12 may be driven together, such as by a belt drive 13, including a suitable reversible motor 14 or alternatively, each reel 11, 12 may be driven separately by separate reel drive motors (not shown) However, any suitable drive system may be utilized.

In the proximity of the anode 8, where the ribbon 10 passes through the hot plasma area 44, ribbon 10 is supported by a cooled backing structure 15 (FIG. 3), including a frame 16 and a top plate 17, the latter being in sliding contact with ribbon 10. The structure 15 is made of a nonmagnetic, electrically conductive material, for example stainless steel or aluminum. A coolant carrying tubing 18 is provided inside the top plate 17, for example by drilling suitable passages 18 therethrough, or, alternatively, it may be provided outside plate 17 but in contact therewith, to obtain a most effective conductive cooling of the ribbon 10. A suitable cooling liquid, such as chilled water, is circulated via ends 19, 20 through tubing 18, sections of which are connected by suitable tubes (not shown). Ends 19 and 20 are preferably connected to an external cooling system (not shown), as it is well known in the art.

Permanent magnets 30 are utilized to confine the active plasma within the area 44 and thus to enhance the sputtering process, as it is well known in the art. However, the sputtering apparatus and method of the invention are not restricted to magnetically enhanced systems and they may be utilized for diode, triode, and other types of known sputtering techniques as well. As it has been mentioned before, the invention is contemplated for use with a wide range of target materials, including magnetic materials. In the preferred embodiment the magnets 30 utilized to enhance the active plasma are in the form of bars having a width corresponding to the width of ribbon 10, as it is best shown in FIG. 3. The orientation of magnets 30 is selected to obtain a desired configuration of the magnetic field in the plasma area 44 as it is shown by flux lines 48 and described, for example, in "Glow Discharge Processes", by Brian Chapman, John Willey and Sons, New York 1980, page 268. It is seen from FIG. 2 that the direction of flux lines 48 is substantially perpendicular to the direction of the electric field designated by the arrow 101 in FIGS. 1 and 2. Thus arrow 102 indicates the direction of the magnetic field provided by magnets 30.

The moveable cathode 10 is coupled to an external high voltage direct current (D.C.) or radio frequency (R.F.) source 31, for example, by means of a shielded power transmission line 32 which is conductively connected to backing structure 15, for example by soldering.

Guide rollers 33, 34 which may be implemented as drive rollers and may also include pinch rollers 58, 59 shown in phantom, are arranged one on each side of the cooled backing structure 15 to guide ribbon cathode 10 along a predetermined path, in contact with the top plate 17 and past the anode 8 at a desired distance therefrom, depending on the particular sputtering application.

It is important that the ribbon guiding mechanism including rollers 33, 34, 58, 59 and any further suitable elements (not shown) which may be necessary to transport the flexible ribbon 10 through a predetermined path with required precision, be designed to maintain a necessary tension of ribbon 10 to keep it from twisting, folding or otherwise distorting the target surface Additional cooling of the ribbon 10 is preferably provided by cooling devices, for example in the form of radiator cooling platters 35, arranged outside the active plasma area 44 at one or both sides of the ribbon path, as it is shown in FIG. 2. These platters 35 may be cooled by circulating therethrough a suitable chilled liquid via tubes 36, 37, respectively connected to an outside cooling system (not shown). If still further cooling is desired, additional cooling tubes 38, 39 may be provided inside the rollers 33, 34, in a similar manner as it has been described above with reference to cooling devices 18 and 35. It will be understood that the respective tubes 19, 20, 36, 37, 38 and 39 may be connected to one or more external cooling devices (not shown) located outside the housing 21, as it is known in the art. It will be readily understood that any such necessary connecting tubes as well as connections 4, 7, 32, 47 provided between the inside of a vacuum chamber such as 26 and its exterior, must have vacuum tight seals 45 as it is shown throughout the drawings A device 41 for continuously measuring the thickness of ribbon 10 and a device 42 for detecting the end of ribbon 10, may be arranged at one or both ends of the path of ribbon 10. Both devices 41, 42 may be of a conventional noncontact type, for example optical, such as generally utilized in the magnetic tape recording industry and similar applications. For example, ribbon 10 may be perforated or made transparent at both ends held by the reels 11, 12. When the end of tape is approaching the device 42, the transparent portion is detected thereby and a control signal is sent to motor drive 14 to reverse its rotation, thus reversing the direction of tape travel between reels 11 and 12. Analogously, measuring device 41 may provide a control signal when the thickness of the ribbon 10 reaches a predetermined minimum, thus indicating need for target replenishment.

Within the inner vacuum chamber 1, a grounded protective shield 43 is preferably utilized and connected to shield 2, as it is shown in FIG. 2. Shield 43 is preferably made of stainless steel or aluminum and it may be utilized to assist in maintaining a desired differential pressure between outer chamber 26 and inner chamber 1 as follows. The differential pressure is preferably obtained by supplying argon under a predetermined pressure utilizing source 23, connected via a throttle valve 25 into the inner vacuum chamber 1, which pressure is considerably higher than that of surrounding chamber 26, which, in turn is maintained by vacuum pump 5 and a throttle valve 24 connected thereto. For example, chamber 26 may have a pressure of 0.1 to $5 \times 10^{-6}$ millitorr and chamber 1 a pressure of 10 to 300 millitorr. Consequently, shield 43 protects the respective elements 11, 12, 33, 34, 35, etc., which are arranged within the inner vacuum chamber 1 but are not directly included in the active plasma area 44, from unwanted sputtering by the target material.

The anode 8, a portion of the moveable ribbon cathode/target 10 present in the active plasma area 44 at a given instant and the cooling backing structure 15 including magnets 30 and supporting the latter portion of the ribbon 10, are respectively arranged within shield 43. As it has been mentioned previously, it is necessary to electrically insulate all the elements arranged within the housing 21 from the grounded shields by well known techniques. For example, the respective elements to be insulated from the grounded shields may be mounted on insulating supporting brackets made of non-conductive material, such as a suitable ceramic material.

Consequently, among other elements, it is necessary to sufficiently insulate in a well known manner ribbon 10, which is at the high electric potential of the cathode from shield 43, specifically at openings 46, 50 respectively provided in shield 43 for passing ribbon 10 therethrough. If desired, a supplemental second argon source 6 may be provided, having a conduit 7 leading directly inside the area enclosed by shield 43, as it is shown in FIG. 2.

Alternatively, instead of utilizing reversible feed/takeup reels 11, 12 and reversing the tape path every time when the end of tape is detected by device 42, it is possible to provide the ribbon 10 as an endless tape which may be transported in a selected direction for a predetermined length of time, or until a minimum value thickness 100 is detected by measuring device 41.

Referring now to FIG. 4, there is shown an alternative configuration of the cooled backing structure 15 of FIGS. 2 and 3. In FIG. 4 the active plasma 44 is surrounded by a basically U-shaped permanent magnet or electromagnet 51 having its opposite south and north poles 52, 53 arranged on opposite sides of the plasma 44 and across the width of ribbon 10. Magnets 52, 53 provide a magnetic field in a direction shown by the arrow 102 generally parallel to the plane of the ribbon cathode/target 10 and thus perpendicular to the direction of electric field 101 between the anode 8 and cathode 10. The magnet 51 is attached to a nonmagnetic electrically conductive supporting structure 54, preferably made of stainless steel or aluminum, which structure 54 also serves as a protective shield. An upper planar surface 55 of a central portion of structure 54 supports the moveable ribbon 10.

Tubes 56 for propelling a suitable cooling liquid, such as water, are arranged immediately below the upper surface 55 in close proximity of the ribbon 10, to obtain a most effective cooling thereof. A shield 57 surrounds the supporting structure 54, magnet 51, anode 8 and a portion of the moveable cathode/target 10. Shield 57 of FIG. 4 basically corresponds to inner shield 43 of FIG. 2 and it serves to protect the elements which are located outside that shield (not shown in FIG. 4) from sputtering, as well as to maintain the differential vacuum as described previously with reference to FIG. 2.

It will be understood that the respective configurations of the supporting structures of FIGS. 3 and 4 are only two of the many possible arrangements which may be provided in accordance with the teachings of the present invention.

Now a preferred method of high rate sputtering in accordance with the present invention will be described with reference to the embodiment of FIGS. 1 and 2. Prior to starting the sputtering operation, the vacuum pump 5 is switched on to provide a low pressure within the chamber 26, for example, in the order of 10-5 millitorr or lower. Thereafter, argon from source 23 is admitted into the inner chamber 1 to obtain a higher pressure therein with respect to the above-indicated pressure of chamber 26, for example, in the order of 20 millitorr or higher. If desired, additional argon from source 6 may be admitted into space 44, as from source 6. It is understood that the above-indicated pressure values may change with respect to a given sputtering application. One or more exterior cooling devices, are turned on and the cooling liquid, chilled to a desired low temperature, is forced through any or all of the tubes such as shown at 19, 20 and 36 to 39 in FIG. 2.

Motor 14 is also turned on, thus causing ribbon 10 to move continuously between reels 11, 12 via a predetermined path, including the rollers 33, 58 and 59, 34 the cooled plate 17 and cooling platters 35. In case the rollers 33, 34 are driven, a corresponding motor drive (not shown) is also activated.

The speed of ribbon 10 is selected to satisfy the particular cooling requirements with respect to a selected target material of the ribbon cathode 10 and to obtain the particular current density necessary for a desired sputtering rate.

It is estimated that current densities of about 500 watts to 5 kilowatts or more per square inch of the cathode/target may be obtained by the high rate sputtering gun of the present invention. For comparison, in the known prior art devices the current density is limited to about 250 watts per square inch. It is estimated that the speed of the moveable ribbon 10 will be 5 inches per minute and higher to obtain necessary cooling thereof, depending on the particular material, size, current density and other characteristic of the ribbon as well as of the sputtering apparatus and application.

After the conditions within the vacuum chamber necessary for a given sputtering application are established, including the desired differential pressures, cooling conditions and any other necessary sputtering conditions such as are well known, the power source 31 (shown in FIG. 2) is turned on to supply a desired D.C. or R.F. power to the cathode 10 and anode 8, thus effecting a glow discharge between these electrodes. It follows from the foregoing description that in the sputtering device of the invention a glow discharge is effected in space 44 between the anode 8 and that portion of the moveable cathode/target 10 which is supported by plate 17 and thus present in the active plasma 44 at any given time. Since the cathode/target 10 moves continuously through the active plasma 44, the target material in the plasma area is being continuously replenished. It follows from the foregoing description that a required intensity of cooling of the target material can be obtained by selecting the speed of the ribbon/target as well as other pertinent parameters with respect to a desired current density and selected material of the target.

For example, a D.C. power of $-500$ V to $-4$ kV may be supplied to the cathode and $+500$ V to $+4$ kV to the anode, via respective insulated cables 32, 32a as best shown in FIG. 3. The substrate 27 may be maintained at zero potential. Alternatively, depending on the application, the substrate 27 may be maintained at the anode potential and consequently, the anode 8 may be deleted. In the latter case, the electric potential and active plasma both develop and are maintained between a portion of cathode 10 supported by structure 15 and substrate 27. In the preferred embodiment of FIG. 2, the cable 32 is connected to the conductive cooled frame 15 and thus to the moveable ribbon 10 via conductive plate 17 of frame 15, as previously described. When, for example, continuously moving plastic tape, such as MYLAR tape, is used as a substrate 27, $-2000$ Volt D.C. may be supplied to the cathode and $+2000$ Volt D.C. to the anode. When utilizing the previously mentioned metallic magnetic material for the ribbon cathode/target of FIG. 2, a material deposition rate in the order of $2 \times 10^4$ Angstroms per minute is estimated to be obtainable by the sputtering gun of the invention. The latter rate is a twofold improvement when comparing to known sputtering devices utilized in manufacturing of magnetic tape.

Thus, because with the present invention the cooling of the cathode/target is substantially improved with respect to known prior art devices, the current density of the cathode/target may be increased accordingly, in turn increasing the sputtering rate. In addition the amount of sputtered material and thus the length of operation time with a given target is significantly increased when comparing to stationary targets, since cooling and thus the life of the target is extended.

FIG. 5 shows the sputtering gun assembly 22 of an alternate embodiment of the invention. To facilitate comparison of the various preferred embodiments described in the specification, like elements in the attached Figures are designated by like reference numerals and their description is not to be repeated. In this embodiment, a moveable cathode/target is provided in the form of a continuously revolving hollow drum 60, also referred to as drum surface 60, which is utilized instead of the ribbon 10 of FIG. 2. The embodiment of FIG. 5 is particularly suitable for, but not restricted to, applications where the target is made of non flexible, fragile material, or a material otherwise susceptible to mechanical damage due to brittleness, fatigue failure, etc., when utilized in the form of a flexible ribbon. Examples of such materials are tungsten, ferrite and similar hard, brittle materials.

For example, drum 60 may be manufactured by vacuum casting of tungsten or cobalt to obtain a homogeneous structure in the form of a relatively thin hollow drum of a desired thickness 100 utilizing techniques well known in the art. The drum 60 is supported by a cooled backing structure 61, similar to the previously described structure 15 of FIGS. 2 and 3. However, an upper plate 62 of structure 61 has a curvature corresponding to that of the drum surface 60. By this latter feature, a better contact with the moveable drum surface 60 is obtained, thus providing better cooling thereof. The cooled backing structure 61 slidably supports the rotating drum surface 60. Cooling tubes 18, magnets 30, anode 8 and shield 43 are respectively arranged in FIG. 5 in a manner similar to the previously described embodiment of the sputtering gun assembly 22 of FIG. 2. The drum 60 is preferably driven by drive rollers 63, 64, arranged on the opposite sides of and outside the protecting shield 43. Pinch rollers 65, 66, shown in phantom in FIG. 5, also may be utilized, if desired, to prevent slipping between the drive rollers 63, 64 and the drum surface 60. The drive rollers 63, 64 may be driven by a suitable motor (not shown), thus providing rotation of the drum 60 in a selected direction shown by arrow 69 or opposite thereto.

Adjacent to the revolving drum surface 60, there are arranged stationary cooling plates 67, 68, which may be of the radiator type, similar to cooling plates 35 of FIG. 2. Plates 67, 68 are curved to follow the drum surface 60 to obtain a more efficient cooling thereof. It will be understood that drum 60 may have any suitable length, and diameter, for example, each in the order of several inches depending on the size of the substrate and other pertinent parameters related to a particular sputtering application.

FIGS. 6A and 6B respectively show simplified top and cross sectional views of a further embodiment of the invention. More particularly, the sputtering gun assembly 22 of the latter embodiment has a moveable cathode/target in the form of a continuously rotating disk 70, having a predetermined thickness 100 and made preferably entirely of a selected target material. The disk 70 is rotated for example by means of a shaft 77 connected to a suitable motor 78 such as known for rotating a turn table. Cooling plates 71, 72 may be arranged on both sides of the disk 70, adjacent to a selected portion thereof. Another, contiguous portion of moveable disk 70 is located in proximity of an anode 74, at a predetermined distance therefrom. The latter portion of disk 70 is slidably supported by a contacting cooled backing structure 73. The anode 74, preferably of circular shape, is similar to the previously described anode 8 of FIG. 5, while the cooled backing structure 73 is similar to the previously described structure 61 of FIG. 5, with the exception of having a planar top plate 79. Anode 74 may have a circular or rectangular cross section. Structure 73 may contain magnets (not shown) providing a magnetic field 102 to enhance the active plasma 44, as disclosed earlier with respect to FIGS. 2 or 5. A suitable D.C. or R.F. power is supplied to the rotating disk cathode 70 and to the anode 74 from a power supply (not shown), corresponding to power supply 31 of FIG. 2 to provide an electric field 101 as described earlier. The cooling plates 71, 72 and an adjacent portion of moveable disk 70 chilled thereby, are respectively surrounded by a grounded protective shielding 76. The entire assembly shown in FIGS. 6A and 6B is arranged in a vacuum chamber, such as chamber 26 of FIG. 1. Other elements, necessary for providing conditions to effect a glow discharge in the area 44 between the anode 74 and cathode 70 of the embodiment of FIGS. 6A, 6B, are similar to those previously described and shown with reference to FIGS. 1, 2 and 5.

In accordance with the sputtering method of FIGS. 6A and 6B, the motor 78 rotates the disk cathode/target 70 as shown by arrow 75 at a predetermined speed to obtain necessary cooling thereof by the respective cooling structure 73 and, if desired, also by cooling plates 71, 72. It follows from the above description that in the embodiment of FIGS. 6A, 6B a portion of the rotating disk cathode/target 70 is present in the plasma area 44 at any given time during operation, while another, contiguous portion may be cooled externally of the plasma area. Thus, an extremely effective cooling of the rotating disk is obtained by the above described preferred embodiment of the invention. The speed of rotation as well as the diameter and thickness of the disk may be selected with respect to a desired current density, sputtering rate, length of target life, and similar considerations and, of course, depending on the necessary cooling. The estimated surface speed of the disk 70 in most applications is in excess of 5 inches per minute.

The embodiment of FIGS. 6A, 6B is particularly suitable, but not restricted to use with a target material which cannot tolerate stress by bending and flexing, as effected by the ribbon cathode target of FIG. 2. The disk 70 may be made, for example of tungsten or cobalt by casting in vacuum, as well known in the art.

As an example, the disk 70 may have a diameter in the order of several inches or larger and rotate at a speed of about 1 to 300 revolutions per minute while a voltage of 500 V to 4 kV may be supplied to the disk and a sputtering rate of over $2 \times 10^4$ Angstroms per minute may be obtained.

It will become apparent to those skilled in the art that in the above-described various embodiments of the invention, any of the anodes, substrates and shields may be provided as cooled structures, by means well known in the art.

While the respective embodiments of FIGS. 2 to 6B have been described as examples utilizing magnetically enhanced sputtering techniques, such as well known in the art, it will be understood that the above-described and other embodiments of the present invention may also be utilized in other types of sputtering devices. For example instead of utilizing the magnetic structures of FIGS. 3 and 4, an additional anode in combination with a hot filament can be used to enhance sputtering, as it is well known from prior art triode sputtering devices.

It follows from the foregoing disclosure with reference to FIGS. 1 and 2 that when the material of drum 60 in FIG. 5 or disk 70 in FIGS. 6A, 6B is magnetic, a small thickness of these respective targets is desirable, for example in the order of 1 to 50 mils, to obtain a desirable supersaturation.

A still further embodiment of a sputtering gun assembly 22 of the invention is shown in FIG. 7 and FIGS. 8A and 8B representing alternative cross sectional views taken along line 8A—8A corresponding to plane 80 of FIG. 7. The sputtering gun assembly 22 of FIG. 7 comprises an anode 81 and a moveable cathode/target 82 in form of a rod, arranged to have its longitudinal axis 83 substantially perpendicular to the plane 80 bisecting the anode 81. Cathode 82 is preferably made of magnetic material forming an electromagnet by means of coil 99 shown in FIG. 7. An upper pole 84 of cathode 82, preferably the south pole 84, is arranged to have its face 105 in close proximity of the anode 81 and at a predetermined distance therefrom, while the north pole 95 is formed by the opposite lower end of rod 82.

In the embodiment of FIG. 7 the south pole 84 forms part of the magnetic circuit utilized to enhance sputtering. Another part of the magnetic circuit is formed by a magnet 86, as shown in FIG. 8A. Alternatively, this may be a plurality of U-shaped magnets 86a as shown in FIG. 8B. The U-shaped magnet 86, or magnets 86a, surround the anode 81 and pole 84 of the cathode 82. The magnets 86, or 86a, are magnetized in such a way that their south pole or poles 89 are arranged on that side of anode 81 which is adjacent to south pole 84 of the moveable cathode 82, while their north pole or poles 90 are arranged on the opposite side of anode 81.

Cathode 82 may be made of a magnetic target material, or suitable magnetic alloys, comprising for example cobalt, iron, nickle, chrominum, etc. Alternatively, cathode 82 may be made of a nonmagnetic target material, for example copper, aluminum, etc., or of suitable nonmagnetic alloys. However, in the latter case, it is necessary to provide magnets 86 such that an even stronger magnetic field is obtained including magnetic flux 86 of a desired intensity in the direction substantially parallel with axis 83, as described previously. The diameter of rod 82 for example may be selected from 0.25 inch to several inches and the rod 82 may be several inches long. A shield 87, for example of stainless steel or aluminum is arranged in the space between the electrodes 81, 84 on one side and the magnets 86 or 86a on the other side thereof, to protect the respective magnets from sputtering. Shield 87 is preferably grounded and it may be cooled, if desired.

The magnetic circuit of FIG. 7 is provided such that the flux path 96 is substantially parallel to axis 83 to obtain a maximum intensity of the magnetic field in the plasma area 44 in the direction of arrow 106.

A rod advancing mechanism 91 is utilized to advance the rod 82 in the direction of arrow 92. For example a rack and pinion mechanism, screw or any other well known suitable device may be utilized to implement mechanism 91. It may be controlled manually or, alternatively, by a suitable motor 92 with appropriate control devices (not shown) connected thereto. The rod 82 is preferably slidably supported by an insulating sleeve 93, for example of a heat resistant material, such as a suitable ceramic material. Sleeve 93 may also be provided as a cooling device, if desired, in which case a suitable cooling liquid (not shown) may be propelled therethrough in a similar manner as in the previously described embodiments.

A power supply 31 may be connected to end 95 of rod 82 by means of a shielded power transmission line 32, in a similar manner as it has been described previously. Other elements of FIG. 7 which are similar to those of the previously described preferred embodiments will not be described here to avoid repetition.

Now the sputtering method in accordance with the embodiment of FIGS. 7, 8A and 8B, will be described. When the conditions necessary to effect sputtering within the vacuum chamber 26 of FIG. 1 are obtained, a glow discharge, also referred to as active plasma, is developed in the area 44 between the anode 81 and the face 105 of upper end portion 84 of the rod cathode/target 82. As the face 105 of cathode 82 is gradually eroded by the sputtering process, the cathode 82 is advanced by mechanism 91 into the active plasma 44 in the direction of arrow 92.

By the embodiment of FIGS. 7, 8A, 8B a high intensity magnetic field is obtainable in the active plasma area 44, for example in the order of 2000 Gauss and over. It is a significant advantage that only a face portion of the cathode 82 is being eroded within the plasma 44 at any given time while another, contiguous portion is located outside the active plasma area. It is a further significant advantage that the aboveindicated eroded portion of the cathode 82 is being continuously replenished by advancing the rod 82 into the plasma. The embodiment of FIGS. 7, 8A, 8B is particularly suitable for target materials which are susceptible to mechanical damage for example due to brittleness, fatigue failure, etc., when submitted to flexing, bending, etc., as ocurrs when the cathode is made, for example in ribbon form, as previously described with reference to FIG. 2.

In the embodiment of FIGS. 7, 8A and 8B, the apparatus and method are similar to those of the previously described embodiments in that a moveable cathode/target 82 with respect to the active plasma 44 is utilized and that the target material can be continuously replenished. However, the latter embodiment differs from the previously described embodiments in that the cathode 82 when made of magnetic material, is not supersaturated by the magnetic field and it forms an active portion of the magnetic structure, utilized to enhance the sputtering process. The end portion 84 of rod 82, which is present in the active plasma is at elevated temperature and no cooling of that portion 84 is provided in the preferred embodiment. Rod 82 is preferably cooled at its portion which is outside the plasma area.

It is a further difference from the the previously described embodiments that the rod cathode of FIGS. 7, 8A, 8B is not provided to pass through the active plasma 44 but instead, rod 82 is provided moveable into the plasma and it is being gradually eroded therein.

It is an advantage of the embodiment of FIG. 7 that there is provided an extremely high magnetic flux density per surface unit of at a cross section of the upper end 84 of rod 82, thus forming an extremely high concentration of magnetic field in the active plasma area 44.

Although the invention has been described in conjuction with various preferred embodiments, it will be appreciated that modifications and changes may be made without departing from the spirit and scope of the invention as defined in the appended claims.

What is claimed is:

1. An apparatus for high rate sputtering a selected target material on a substrate in vacuum, comprising:
   (a) a vacuum chamber having an anode, a cathode and means for providing an active plasma therebetween;
   (b) said cathode being moveable within said vacuum chamber through said active plasma at a distance from said substrate, said cathode comprising said selected target material; and
   (c) means for moving said cathode through said active plasma to have a portion of said cathode arranged within said active plasma while another, contiguous portion of said cathode is arranged outside said active plasma.

2. The apparatus of claim 1 wherein said means for moving said cathode is provided as a continuously moving means and wherein said portion of said moveable cathode which is within said active plasma at a given time is substantially smaller than said another, contiguous portion thereof.

3. The apparatus of claim 1, further comprising a cooling means arranged in close proximity of said moveable cathode.

4. The apparatus of claim 3 wherein said means for providing an active plasma includes means for providing an electric field between said anode and said cathode;
said moveable cathode is arranged within said active plasma to have a thickness extending in a direction substantially parallel with said electric field; and
said cathode is moveable through said active plasma in a direction substantially perpendicular to said electric field.

5. The apparatus of claim 4 wherein said moveable cathode comprises a magnetic target material, said apparatus further comprising:
means for providing a magnetic field in a direction substantially perpendicular to said electric field to enhance said active plasma;
and wherein a portion of said target material which is arranged within said active plasma is supersaturated by said magnetic field.

6. The apparatus of claim 5 wherein said thickness of said target material comprised in said cathode is small relative to a length and width thereof.

7. The apparatus of claim 3, wherein said cooling means comprises a first cooling means arranged in close proximity of said portion of said moveable cathode which is within said active plasma at a given time.

8. The apparatus of claim 7, further comprising a supporting structure for slidably supporting a portion of said moveable cathode, which is within said active plasma at a given time, and wherein said first cooling means is arranged within said supporting structure.

9. The apparatus of claim 7, wherein said first cooling means is provided as a conductive cooling means.

10. The apparatus of claim 3, wherein said cooling means comprises a second cooling means arranged in close proximity of said another, contiguous portion of said moveable cathode which is outside said active plasma at a given time.

11. The apparatus of claim 10, wherein said second cooling means is provided as a radiation cooling means.

12. The apparatus of claim 10, further comprising a shielding means for separating said means for moving said cathode and said second cooling means from said active plasma.

13. The apparatus of claim 1, wherein said cathode has and end portion and including means for reversing the direction of movement of said cathode when the portion of said cathode arranged within said active plasma is a predetermined distance from said end portion.

14. The apparatus of claim 13, further comprising means for monitoring the thickness of said moveable cathode, said monitoring means being arranged along a path of said moveable cathode outside said active plasma.

15. An apparatus for high rate sputtering a selected target material in vacuum, comprising:
a vacuum chamber having an anode, a moveable cathode comprising said selected target material and means for establishing conditions necessary to provide an active plasma between said anode and a portion of said moveable cathode arranged in proximity of said anode at a given time;
means for continuously moving said cathode to have a portion thereof arranged within said active plasma while another, contiguous portion thereof is arranged outside said active plasma at a given time;
a cooled backing structure for slidably supporting said portion of said moveable cathode which is within said active plasma; and
additional cooling means arranged within a path and in close proximity of said moveable cathode outside said active plasma to provide cooling of said another, contiguous portion of said cathode.

16. The apparatus of claim 15 wherein said moveable cathode has a relatively small thickness with respect to its length and width.

17. An apparatus for high rate sputtering a selected magnetic target material in vacuum, comprising:
a vacuum chamber having an anode, a moveable cathode comprising said magnetic target material and means for establishing conditions necessary to provide an active plasma between said anode and a portion of said moveable cathode arranged in proximity of said anode at a given time, said vacuum chamber further comprising means for providing a magnetic field to enhance said active plasma;
means for continuously moving said cathode to have a portion thereof arranged within said active plasma while another, contiguous portion of said moveable cathode is arranged outside said plasma at a given time;
a cooled supporting structure for slideably supporting said portion of the moveable cathode within said active plasma; and
additional cooling means arranged within a path and in close proximity of said moveable cathode outside said active plasma to provide cooling of said another, contiguous portion of said cathode;
said moveable cathode having a thickness selected to obtain supersaturation of the magnetic target material in a portion of said moveable cathode arranged in said active plasma at a given time.

18. The apparatus of claims 15 or 17, further comprising shielding means for separating said means for continuously moving said cathode and said additional cooling means from said active plasma.

19. The apparatus of claims 15 or 17, further comprising means for continuously monitoring a thickness of said moveable cathode, said monitoring means being arranged along a path of said moveable cathode outside said active plasma.

20. An apparatus for high rate sputtering a selected target material in vacuum, comprising:
a vacuum chamber having an anode, a cathode and means for establishing conditions necessary to provide an active plasma between said anode and said cathode, said cathode comprising said selected target material and being provided in form of a flexible ribbon means;
means for supporting a portion of said moveable ribbon means within said active plasma at a predetermined distance from said anode;
storage means for storing another, contiguous portion of said ribbon means, which is outside said active plasma; and
means for moving said ribbon means between said storage means and said supporting means, through said active plasma.

21. The apparatus of claim 20, further comprising first cooling means provided within said supporing means.

22. The apparatus of claim 20, further comprising second cooling means arranged outside of said plasma and within a path of said ribbon means between said supporting means and said storage means.

23. An apparatus for high rate sputtering a selected target material in vacuum, comprising:
a vacuum chamber having an anode, a moveable cathode and means for establishing conditions necessary to provide an active plasma between a portion of said moveable cathode and said anode, said cathode comprising a selected target material and being provided in form of a flexible ribbon means;
cooled supporting means arranged at a predetermined distance from said anode for slidably supporting said portion of said cathode passing through said active plasma at a given time;
two corresponding reels respectively attached to opposite ends of said ribbon means for storing a contiguous portion of said ribbon means which is outside said active plasma; and
means for passing said ribbon means between said corresponding reels and over said cooled supporting means.

24. The apparatus of claim 23, comprising further cooling means arranged within a ribbon path in close proximity of said ribbon means and outside said active plasma.

25. The apparatus of claim 23, further comprising means arranged along a ribbon path outside said active plasma for sensing an end of said ribbon means and providing a control signal for reversing a direction of movement of said ribbon means.

26. The apparatus of claim 23, further comprising means for monitoring a thickness of said ribbon means, said monitoring means being arranged along a path of said ribbon means outside said active plasma.

27. The apparatus of claim 23, further comprising shield means arranged between said active plasma and respective other means arranged within said vacuum chamber but outside said active plasma for protecting said other means from sputtering.

28. An apparatus for high rate sputtering a selected target material in vacuum, comprising:
a vacuum chamber having an anode, a moveable cathode and a means for establishing conditions necessary to provide an active plasma therebetween, said cathode being provided in the form of a rotating drum surface comprising said selected target material;
supporting means arranged at a predetermined distance from said anode for slidably supporting a portion of said rotating drum surface within said active plasma, while another contiguous portion of said drum surface is outside said active plasma at a given time; and
means for rotating said drum surface at a predetermined speed.

29. The apparatus of claim 28, further comprising first cooling means provided within said supporting means.

30. The apparatus of claim 28, further comprising second cooling means arranged in close proximity of said rotating drum surface outside said active plasma.

31. The apparatus of claim 30, further comprising shielding means for separating said means for rotating said drum surface and said second cooling means from said active plasma.

32. The apparatus of claim 28, further comprising means for continuously monitoring a thickness of said rotating drum surface, said monitoring means being arranged along a path of said rotating drum surface outside said active plasma.

33. The apparatus of claim 28 wherein said rotaing drum surface is arranged to have a longitudinal axis in a direction substantially perpendicular to an electric field formed between said anode and said rotating drum surface.

34. An apparatus for high rate sputtering a selected target material in vacuum, comprising:
a vacuum chamber having an anode, a cathode, and means for establishing conditions necessary to provide an active plasma therebetween, said cathode being provided in the form of a rotating disk comprising said selected target material;
supporting means arranged at a predetermined distance from said anode for slidably supporting a portion of said rotating disk within said active plasma, while another, contiguous portion of said disk is outside said active plasma at a given time; and
a means for rotating said disk at a predetermined speed.

35. The apparatus of claim 34, further comprising a first cooling means provided within said supporting means.

36. The apparatus of claim 34, further comprising a second cooling means arranged in close proximity of said rotating disk outside said active plasma.

37. The apparatus of claim 35, further comprising shielding means for separating said means for rotating said disk and said second cooling means from said active plasma.

38. The apparatus of claim 34, further comprising means for continuously monitoring a thickness of said rotating disk, said monitoring means being arranged along a path of said rotaing disk outside said active plasma.

39. The apparatus of claim 34, wherein said rotating disk is arranged to have a planar surface extending in a direction substantially perpendicular to that of an electric field formed between said anode and said rotating disk.

40. The apparatus of claims 20, 28 or 34, wherein said cathode comprises a magnetic target material, said apparatus further comprising means providing a magnetic field to enhance said active plasma and wherein a thickness of said moveable cathode is selected small relative to its other dimensions to obtain supersaturation of said target material within said active plasma.

41. An apparatus for high rate sputtering a selected magnetic target material in vacuum, comprising:
- a vacuum chamber having an anode and a moveable cathode and means for establishing conditions necessary to provide an active plasma between said anode and said cathode;
- said moveable cathode being provided of said magnetic target material in form of a magnetized rod, said magnetized rod being moveable in the direction of its longitudinal axis;
- first end of said magnetized rod being arranged within said active plasma and forming a first magnetic pole of a predetermined polarity, while another, contiguous portion of said rod, including a second opposite end thereof forming a second magnetic pole of opposite polarity, is arranged outside said active plasma;
- means for providing a magnetic field passing through said active plasma and said first magnetic pole of said magnetized rod, in a direction substantially parallel to said longitudinal axis of said rod, said means for providing said magnetic field having a magnetic pole of the same polarity as said first magnetic pole of said rod and being arranged in close proximity thereof; and
- means for advancing said rod into said active plasma.

42. The apparatus of claim 41, further comprising means for slidably supporting said contiguous portion of said rod which is outside said active plasma.

43. The apparatus of claim 42, said slidably supporting means is provided as a cooling means.

44. The apparatus of claim 41, further comprising shield means arranged between said active plasma and respective other means arranged outside said active plasma for protecting said other means from sputtering.

45. An apparatus for high rate sputtering a selected magnetic target material in vacuum on a moveable nonmagnetic elon gated substrate, comprising:
- a vacuum chamber having an anode and a moveable cathode and a means for providing conditions necessary to obtain an active plasma between said anode and a portion of said moveable cathode which is in close proximity of said anode at a given time, said moveable cathode being formed of said selected target material in the form of a continuously moveable ribbon, rotating drum surface or rotating disk, respectively;
- means for providing a magnetic field to enhance said active plasma;
- means for moving said cathode through said active plasma to have a portion thereof arranged within said active plasma while another, contiguous portion of said moveable cathode is arranged outside said active plasma;
- said moveable cathode having a thickness selected to obtain supersaturation by said magnetic field of said portion of said moveable cathode which is within said active plasma, at a given time;
- first cooling means for slidably supporting a portion of said moveable cathode within said active plasma; and
- second cooling means arranged in close proximity of said moveable cathode within a path thereof outside said active plasma.

46. The apparatus of claim 45, further comprising a shielding means for separating said active plasma from said means for moving said cathode and said second cooling means.

47. The appratus of claim 45, further comprising a means for monitoring the thickness of said moveable cathode, said monitoring means being arranged along a path of said moveable cathode outside said active plasma.

48. A method of high rate sputtering a selected target material on a substrate in vacuum, comprising the steps of:
- forming an anode and a cathode in a vacuum chamber and providing conditions necessary for obtaining an active plasma therebetween, said cathode comprising said selected target material;
- providing said cathode to be moveable within said vacuum chamber at a distance from said substrate; and
- moving said through said active plasma to have a portion thereof within said active plasma while having another, contiguous portion thereof outside said active plasma.

49. The method of claim 48 wherein said step of moving said cathode comprises a step of continuously moving said cathode.

50. The method of claim 48 further comprising steps of cooling said moveable cathode both within and outside said active plasma.

51. The method of claim 50 further comprising the step of providing a structure for slidably supporting said moveable cathode within said active plasma, and wherein said step of cooling said moveable cathode within said active plasma is provided by said structure.

52. The method of claim 48, wherein a thickness of said target material comprised in said cathode is being monitored outside said active plasma.

53. The method of claim 48, further comprising a step of shielding said active plasma for protecting means arranged in said vacuum chamber but outside said active plasma from sputtering.

54. The method of claim 48, wherein a magnetic target material is selected, further comprising the steps of forming a magnetic field to enhance the active plasma and selecting a thickness of said moveable cathode such that a portion of said target material comprised therein which is present in the active plasma at a given time is supersaturated by said magnetic field.

55. The method of claim 48, wherein said portion of said moveable cathode which is within said active plasma at a given time is substantially smaller than said another, contiguous portion thereof.

56. The apparatus of claims 1, 2, 3, 8, 10 or 13, wherein said moveable cathode is provided in the form of a flexible ribbon moving through said active plasma at a predetermined speed.

57. The apparatus of claims 1, 2, 3, 8 or 10 wherein said moveable cathode is provided in the form of a rotating drum continuously moving through said active plasma at a predetermined speed.

58. The apparatus of claims 1, 2, 3, 8 or 10, wherein said moveable cathode is provided in the form of a disk continuously moving through said active plasma at a predetermined speed.

* * * * *

UNITED STATES PATENT AND TRADEMARK OFFICE
CERTIFICATE OF CORRECTION

PATENT NO. : 4,434,037
DATED : February 28, 1984
INVENTOR(S) : James D. Crank

It is certified that error appears in the above-identified patent and that said Letters Patent are hereby corrected as shown below:

Column 12, line 61, after "rod" insert --82--;

Column 17, line 34, after "42" insert --wherein--;

Column 18, line 23, after "said" (first occurrence) insert --cathode--.

Signed and Sealed this

Twenty-seventh Day of August 1985

[SEAL]

Attest:

DONALD J. QUIGG

Attesting Officer   Acting Commissioner of Patents and Trademarks